United States Patent [19]

Moughanni et al.

[11] Patent Number: 5,402,458
[45] Date of Patent: Mar. 28, 1995

[54] MECHANISM TO ACCELERATE COUNTER TESTING WITHOUT LOSS OF FAULT COVERAGE

[75] Inventors: Claude Moughanni; Mark W. McDermott, both of Austin, Tex.

[73] Assignee: Cyrix Corporation, Richardson, Tex.

[21] Appl. No.: 134,422

[22] Filed: Oct. 8, 1993

[51] Int. Cl.$^6$ .............................................. H03K 21/40
[52] U.S. Cl. ......................................... 377/29; 377/33
[58] Field of Search .............. 327/29, 33, 56, 114–116

[56] References Cited

U.S. PATENT DOCUMENTS 4,336,448  6/1982  Shipp et al. ........................... 377/29

OTHER PUBLICATIONS

IBM Tech Disc. Bul. "Testing Counters" Bodner et al. vol. 18, No. 3 Aug. 1975.

*Primary Examiner*—Margaret Rose Wambach
*Attorney, Agent, or Firm*—Andrew S. Viger; John L. Maxin

[57] ABSTRACT

Test circuitry for a counter of n number of bits is described. The circuitry includes that which divides the counter into s number of segments when the counter is being tested in a test mode. The invention also includes circuitry for detecting when each segment nears the last count and overriding test mode to reenable a between-segment clock path between the segments before the last count to permit the last count to ripple through the counter to test connections between the segments on the next clock cycle. Previous test implementations did not test the interface between segments because of the prohibitive cost in tester time. In one embodiment, assuming equal numbers of b bits per segment, to fully test a counter using previous techniques, $2^{(n-b)}+2^b$ clock cycles would be required. In this technique, only $(s-2)+2^b$ clock cycles are required.

7 Claims, 1 Drawing Sheet

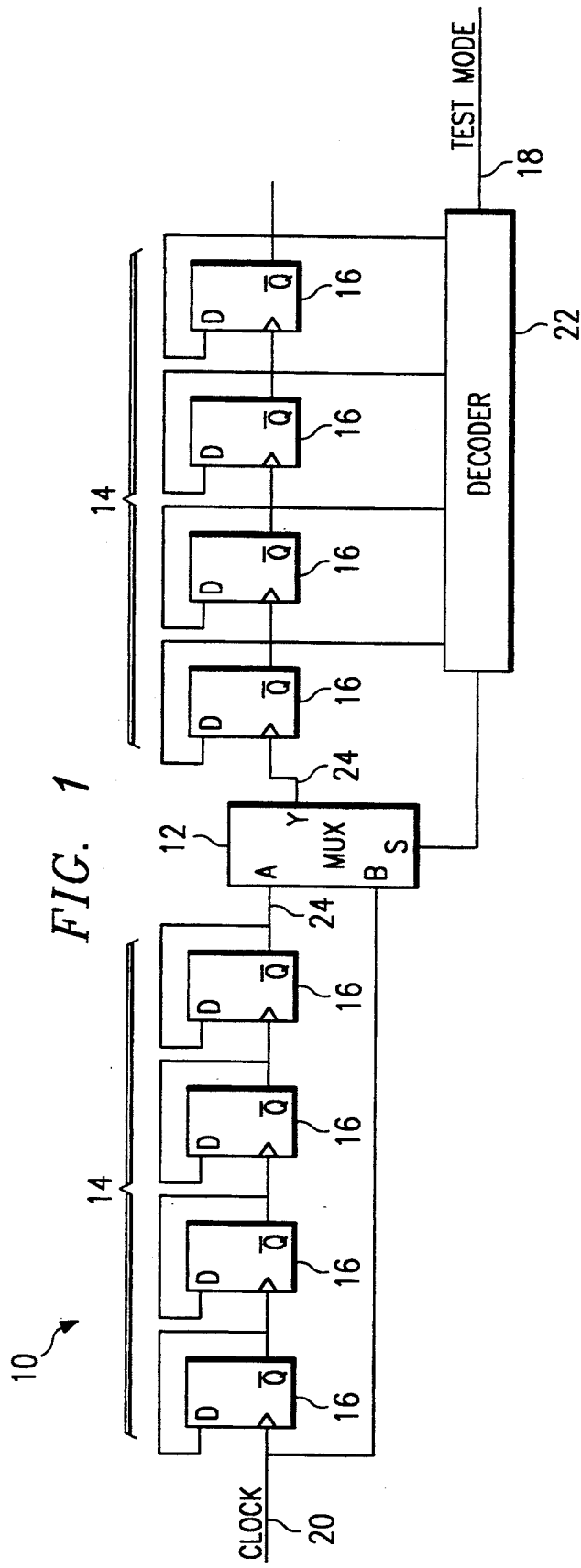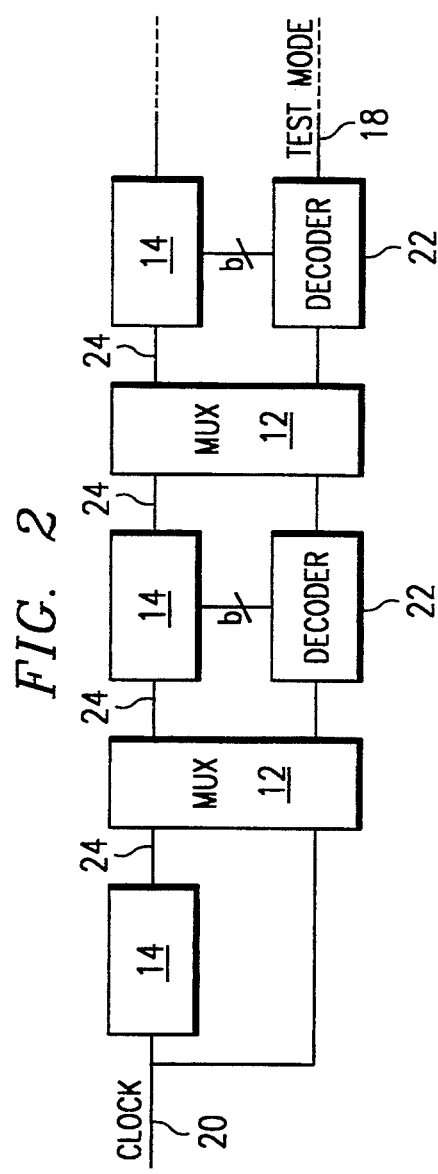

MECHANISM TO ACCELERATE COUNTER TESTING WITHOUT LOSS OF FAULT COVERAGE

FIELD OF THE INVENTION

The invention relates to circuitry for testing counters in integrated circuits, and more particularly relates, in one embodiment, to circuitry for segmenting counters and testing them in parallel as well as the connections or interfaces between segments.

BACKGROUND OF THE INVENTION

Without limiting the scope of this invention, this background information is provided in the context of a specific problem to which the invention has application. Large counters for integrated and other circuits, which may also be referred to as high bit-count counters, are used as time-out counters or timers in power-management devices and the like. For example, time-out counters may be used to time a certain function in real time, e.g. screen display, disk drive, etc. However, to exhaustively test such counters in real time consumes an exorbitant amount of tester time. Typically such counters are tested by breaking the counter or divider or similar structure into segments and then test each smaller segment in parallel using a faster clock and observe the output of each of the segments. While this method accelerates the testability of the counters, it does not test the interface or connections between the segments. To fully test the prior art counters by also testing the interface, one would have to clock the counter its full amount in normal mode, and since the normal mode counter clock operates slower in normal mode than in test mode even more real time on the tester is consumed. However, even if the test mode operates at the same frequency as the normal mode, the need would still exist for testing all of the connections between the segments for exhaustive testing.

There thus remains a need to test not only each segment of the counter, but also the interfaces between segments and in a very brief portion of tester time.

SUMMARY OF THE INVENTION

In accordance with the present invention, there is provided, in one embodiment, test circuitry for a counter of n bits including circuitry dividing the counter into s number of segments when the counter is being tested in a test mode. Also included is circuitry for detecting when each segment nears the last count and overriding test mode to reenable a clock path between the segments before the last count to permit the last count to ripple through the counter to test all of the connections between the segments.

One technical advantage of this circuitry is that it not only permits rapid and exhaustive testing of each segment of the counter, but also the connections between the segments without employing a time consuming procedure. Thus, all the paths that would be used in normal operation would be tested. These advantages are accomplished by detecting when each segment nears the last count and then reenabling the paths between the segments.

BRIEF DESCRIPTION OF THE DRAWINGS

FIG. 1 is an illustration of an eight bit counter divided by a mux into two segments of four bits each which contains the feedback circuitry for overriding test mode and reenabling the path between the segments; and FIG. 2 is a more general depiction of the test circuitry of this invention.

DETAILED DESCRIPTION OF THE INVENTION

Referring to FIG. 1, the invention herein also uses muxes 12 to segment the counter 10 into segments 14 of bits 16 each upon asserting test mode on line 18, as in the prior art. Within the scope of this invention, the term "counter" refers to any counter, timer, time-out counter, etc. which may be segmented and tested in parallel in accordance with this invention. Each segment 14 is tested in parallel and a particular output is expected and compared with that observed. However, when the segments 14 are clocked via clock line 20 to reach the next-to-last count a new feedback loop is employed. For example, for an 8-bit counter 10 divided into 2 segments 14 of 4 bits 16 each as shown in FIG. 1, each segment 14 would be clocked until they reached the count of Eh (hexidecimal). Decoder circuitry 22 would then detect the count of Eh (next-to-last) and then feedback to override the test mode and reenable the clock path 24 between the two 4-bit segments 14 (turn off test mode so the muxes are no longer disconnecting the segments). The next clock would set the count at Fh and the next would ripple through all segments 14 of the counter 10 and thus test the interface or connection 24 between the segments 14. The output of the test both during the parallel test and the rippled through last bit would be observed for the expected result. It will also be appreciated that there are any number of ways to provide or implement decoder circuitry 22 and the invention is not limited thereby.

FIG. 2 depicts a more general representation of the inventive test circuitry showing at least three segments 14 of b bits each. Once each segment 14 reaches a predetermined value, decoders 22 detects the conditions, overrides test mode and reenables connections 24 between segments 14 so that they can be tested.

It should also be appreciated that the exact time to override test mode and reenable the clock path 24 between segments 14 is arbitrary. If reenabling connection 24 occurs on the cycle just before the clock cycle that causes the counter to ripple through (e.g. Fh in the above example), the design should ensure that the path 24 is certain to be reestablished prior to that clock. On the other hand, if connection 24 is reenabled too late, the time savings of the present invention will be diminished. Stated another way, the exact predetermined value at which the decoder overrides test mode and reenables the between-segment clock path is arbitrary and dependent upon the design and speed of the system and should not be limited to any particular value within the scope of this invention. In one sense, the test mode is global for the chip and the override is local for the counters.

The technical advantages of the invention are further illustrated by an actual example of its implementation. The Cyrix LVC chip set has 8 bit counters that are clocked by a ½ Hz clock[1], to a maximum time-out duration of (256×1 sec./60 sec./min.)=8.5 minutes. This is a prohibitive cost in tester time. Prior art approaches to test such counters involve breaking the counter into segments and bringing in the 1 MHz clock into each segment in parallel and then observe the output of each of the segments. The 8 bit counters on the LVC would be divided into 2 segments of 4 bits each, e.g. While this method accelerates testability, it does not test the interface between the segments. Generally, these connections are assumed to be good, which may be a reasonable assumption for small counters and few segments, but as the counter size increases, the number of counters increases and the number of segments increases, the probability of one of the interfaces between the segments being defective increases. Appendix A presents a printout of an actual implementation of the 8-bit counter 10 undergoing test depicted in FIG. 1.

[1] It should be noted that the ¼ Hz clock is generated with a 1 MHz clock divided $2^{21}$ times.

The larger the counter, the more useful this inventive method becomes because the time savings increases exponentially. For example, if a 16 bit counter is divided into 2 segments with 8 bits per segment, using the inventive circuitry, the following occurs. It takes 255 clock cycles to get both segments to the count of FEh. The feedback circuitry then enables the "between-segment" clock path before the last count comes in and ripples through from one segment to the other using the normal clock mode path. Test mode is overrode for this last clock cycle.

To cover the same normal mode clock path using the prior art method, one would have to clock the counter 256 times in normal mode on top of and beyond the 256 clock cycles in test mode. It should be additionally noted that in some embodiments the normal mode counter clock operates slower in normal mode, thus consuming for even more real time on the tester. However, this invention will also find utility in systems where normal mode and test mode operate at the same frequency.

To further illustrate the invention, more than two segments can be created, as in FIG. 2. Table I presents the contrast between the clock cycles required for exhaustive counter testing between the prior method and the inventive method for various configurations. For simplicity of presentation, it is assumed that all segments are of equal size. However, it will be understood that the invention is not limited to such a configuration and that the segments may be varied in size within the scope of this invention. Such irregular division would simply complicate the calculation of the clock cycle savings. The formulae for determining the number of clock cycles for complete test coverage are given below:

Prior method clock cycles: $2^{(n-b)}+2^b$

Inventive method clock cycles: $(s-2)+2^b$ where n = number of bits in the counter (n = s × b for equal segments)
s = number of segments
b = number of bits per segment

TABLE I

| Comparison of Prior and Inventive Methods | | | | |
| --- | --- | --- | --- | --- |
| Bits in counter (n) | Number of segments (s) | Bits per segment (b) | Test time in clock cycles | |
| | | | Invention | Prior method |
| 16 | 2 | 8 | 256 | 256 + 256 |
| 16 | 4 | 4 | 1 + 16 | 4K + 16 |
| 32 | 4 | 8 | 2 + 256 | 16M + 256 |
| 32 | 8 | 4 | 6 + 16 | 256M + 16 |

By comparing the last two columns, it is apparent that as the number of bits in the counter and the number of segments increases, the savings in test time between the prior method and that of the invention increases appreciably.

Many modifications may be made in the test circuitry of this invention without departing from the spirit and scope of the invention which are defined only in the appended claims. For example, the circuitry and its protocol might be adapted to test other structures that are generally time consuming to evaluate and that might be made into segments to shorten tester time.

APPENDIX A

```
/* Eight bit up-counter with single reset input */
module counter(out, clk, rst, testmode);
output  [7:0] out;
input   clk, rst, testmode;
wire testmode;
mshra mshra0(out[0], clk,     rst, !out[0]);
mshra mshra1(out[1], !out[0], rst, !out[1]);
mshra mshra2(out[2], !out[1], rst, !out[2]);
mshra mshra3(out[3], !out[2], rst, !out[3]);
// Breaking the 8-bit counter to two 4-bit counters during test mode.
wire #10 select = testmode & ! (out [5] & out[6] & out[7]);
wire midclk = (!select) ? !out [3] : clk;
mshra mshra4(out[4], midclk , rst, !out[4]);
mshra mshra5(out[5], !out[4], rst, !out[5]);
mshra mshra6(out[6], !out[5], rst, !out[6]);
mshra mshra7(out[7], !out[6], rst, !out[7]);
endmodule
```

We claim:

1. Test circuitry for testing in a test mode a counter of n bits by dividing the counter into segments and testing each segment separately, comprising:

segmentation circuitry that, for the test mode, divides the counter into at least two segments;

the segmentation circuitry being operable in the test mode (i) to disable a clock path between each segment, and (ii) to provide a clock signal substantially simultaneously to each segment such that each segment counts in parallel;

decoder circuitry that detects when at least one segment reaches near a last count and then reenables the clock path between each segment before the last count to permit the last count in each segment to ripple to the next segment to test connections between the segments.

2. The test circuitry of claim 1 where one or more muxes divide the counter into s segments when the counter is being tested in test mode.

3. The test circuitry of claim 1 further comprising circuitry for counting clock cycles through each segment in parallel.

4. Test circuitry decoder circuitry that detects when at least one segment reaches near a last count and then reenables the clock path in each mux before the last count to permit the last count in each segment to ripple to the next segment to test connections between the segments.

5. Test circuitry for testing in a test mode a counter of n bits by dividing the counter into at least two segments and testing each segment separately, comprising:

one or more muxes, respectively disposed between each segment, and operable in the test mode to divide the counter into s segments of b bits each where s × b+n, and disable a clock path between each segment;

clock testing circuitry that provides a clock signal to each segment in parallel thereby initiating counting in each segment substantially simultaneously; and decoder circuitry that detects when at least one segment reaches near a last count and then reenables the clock path in each mux before the last count to permit the last count in each segment to ripple to the next segment to test connections between the segments.

6. The test circuitry of claim 5 where the formula for the number of clock cycles to test the counter is $(s-2)+2^b$.

7. The test circuitry of claim 5 where the decoder circuitry overides test mode and reenables the clock path between the segments on a clock cycle equal to or before the next to last count.

* * * * *